(12) United States Patent
Miyamoto et al.

(10) Patent No.: US 6,225,148 B1
(45) Date of Patent: *May 1, 2001

(54) METHOD OF FABRICATING SEMICONDUCTOR DEVICE

(75) Inventors: Shoichi Miyamoto; Takashi Ipposhi, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/221,121

(22) Filed: Dec. 28, 1998

(30) Foreign Application Priority Data

Jul. 8, 1998 (JP) .................................................. 10-192801

(51) Int. Cl.⁷ .............................. H01C 21/00; H01C 21/20
(52) U.S. Cl. ......................... 438/151; 438/163; 438/270; 438/282; 438/589
(58) Field of Search ........................... 438/29, 34, 151, 438/270, 282, 589, 163, 305, 152–157, 161–166

(56) References Cited

U.S. PATENT DOCUMENTS

| 5,641,980 | * | 6/1997 | Yamaguchi et al. | 257/347 |
| 5,736,435 | * | 4/1998 | Venkatesan et al. | 438/151 |
| 5,739,574 | * | 4/1998 | Nakamura | 438/29 |
| 5,926,703 | * | 7/1999 | Yamaguchi et al. | 438/163 |
| 5,982,005 | * | 11/1999 | Hidaka et al. | 257/347 |
| 6,064,090 | * | 5/2000 | Miyamoto et al. | 257/347 |

FOREIGN PATENT DOCUMENTS 4-239745   8/1992   (JP) .

* cited by examiner

Primary Examiner—Vu A. Le
Assistant Examiner—Michael S. Lebentritt
(74) Attorney, Agent, or Firm—Oblon, Spivak, McClelland, Maier & Neustadt, P.C.

(57) ABSTRACT

A method of fabricating an SOIMOS transistor, isolated by trench isolation, which can prevent a gate oxide film from dielectric breakdown on peripheral edge portions of an SOI layer while preventing formation of parasitic MOS transistors on the peripheral edge portions of the SOI layer under a gate electrode is provided. A nitride film (6) is removed with phosphoric acid of about 160° C. in temperature and thereafter a polysilicon film (5) is removed by isotropic dry etching, thereby leaving a pad oxide film (4) and side wall oxide films (7) in a state enclosed with a deposition oxide film (8). Thereafter the pad oxide film (4), the side wall oxide films (7) and the deposition oxide film (8) are simultaneously removed with hydrofluoric acid.

11 Claims, 12 Drawing Sheets

METHOD OF FABRICATING SEMICONDUCTOR DEVICE

BACKGROUND OF THE INVENTION

1. Field of the Invention

The present invention relates to a method of fabricating a semiconductor device, and more particularly, it relates to a method of fabricating a semiconductor device on an SOI (silicon on insulator) substrate.

2. Description of the Background Art

A semiconductor device (hereinafter referred to as an SOI semiconductor device) formed on an SOI substrate is isolated by the technique of trench isolation filling up an isolation region with an oxide film. A method of fabricating an SOIMOS transistor which is isolated by trench isolation is now described with reference to FIGS. 29 to 38 successively showing steps of the method.

First, an SOI substrate formed by a silicon substrate 1, a buried oxide film 2 buried in this silicon substrate 1 and an SOI layer 3 formed on the buried oxide film 2 is prepared for forming a pad oxide film 4 of about 100 to 300 Å in thickness on the SOI layer 3 by thermal oxidation and further forming a nitride film 6 of about 2000 Å in thickness thereon by CVD, as shown in FIG. 29. Then, a resist film 101 is patterned on the nitride film 6 in a portion corresponding to an active region described later.

The SOI substrate may be formed by SIMOX (separation by implanted oxygen), wafer bonding or any other method.

Then, the resist film 101 is employed as a mask for selectively removing the nitride film 6 by anisotropic dry etching such as RIE (reactive ion etching), as shown in FIG. 30. Etching conditions for the nitride film 6 and the pad oxide film 4 are so approximate to each other that the pad oxide film 4 is also etched under the conditions for etching the nitride film 6. The selection ratio is about 1 to 2.

Then, an oxide film of about 500 Å in thickness is formed on the overall surface by CVD employing TEOS (tetraethyl orthosilicate) and so anisotropically etched that this oxide film remains on side surfaces of the nitride film 6 and the pad oxide film 4 as side wall oxide films 7 in self alignment, thereby obtaining the structure shown in FIG. 31.

Then, the nitride film 6 and the side wall oxide films 7 are employed as masks for selectively removing the SOI layer 3 by anisotropic dry etching, as shown in FIG. 32.

Then, a deposition oxide film 8 having a thickness (e.g., about 5000 Å) larger than the total thickness of the SOI layer 3, the pad oxide film 4 and the nitride film 6 is formed on the overall surface by CVD for covering the active region and isolation regions as shown in FIG. 33, and thereafter polished and planarized by CMP (chemical mechanical polishing) until exposing the nitride film 6. FIG. 33 shows an intermediate stage of the step of planarizing the deposition oxide film 8.

Then, the nitride film 6 is removed with phosphoric acid of about 160° C. in temperature, for leaving the pad oxide film 4 and the side wall oxide films 7 in a state enclosed with the deposition oxide film 8 as shown in FIG. 34. Then, an impurity is injected into the SOI layer 3 through the pad oxide film 4 for channel injection (channel doping), and thereafter the pad oxide film 4 is removed with hydrofluoric acid. Referring to FIG. 34, the pad oxide film 4, the side wall oxide films 7 and the deposition oxide film 8 are simultaneously removed by the hydrofluoric acid as shown by arrows.

FIG. 35 shows the pad oxide film 4 not yet completely removed, and FIG. 36 shows the state after complete removal of the pad oxide film 4. As shown in FIG. 36, depression parts DP are formed on the deposition oxide film 8 in the vicinity of peripheral edge portions of the SOI layer 3. The side wall oxide films 7 which are TEOS oxide films are removed with the hydrofluoric acid faster than the pad oxide film 4 which is a thermal oxide film. Thus, the side wall oxide films 7 are removed before the pad oxide film 4 is completely removed, to facilitate removal of the deposition oxide film 8 on the portions provided with no side wall oxide films 7.

Then, a gate oxide film 9 of about 70 Å in thickness is formed on the SOI layer 3, and thereafter a gate electrode 10 of about 2000 Å in thickness is formed on the gate oxide film 9 and the deposition oxide film 8, as shown in FIG. 37.

Thereafter the patterned gate electrode 10 is employed as a mask for injecting an impurity into the SOI layer 3 and forming source/drain regions (not shown) in self alignment, parts of the gate oxide film 9 are removed except that located under the gate electrode 10, and an interlayer insulating film 11 is formed oh the overall surface. Contact holes CH are formed to reach the gate electrode 10 and the source/drain regions through the interlayer insulating film 11 and conductor layers are buried in the contact holes CH for forming wiring layers 12, thereby obtaining the SOI semiconductor device shown in FIG. 38.

However, the conventional SOI semiconductor device fabricated through the aforementioned steps has the following problems:

When the pad oxide film 4 formed on the SOI layer 3 is removed, the depression parts DP are disadvantageously formed on the deposition oxide film 8 in the vicinity of the peripheral edge portions of the SOI layer 3, as shown in FIG. 36. If the gate oxide film 9 and the gate electrode 10 are formed on the SOI layer 3 in this state, it comes to that the gate oxide film 9 and the gate electrode 10 are formed also on the depression parts DP.

FIG. 39 shows one of the depression parts DP in detail. As shown by arrows in FIG. 39, the part of the gate electrode 10 located in the depression part DP applies an electric field to the gate oxide film 9 on the peripheral edge portion of the SOI layer 3 in operation of the device, and hence the electric field strength on this part exceeds that on the part of the gate oxide film 9 located on the major surface of the SOI layer 3, to result in dielectric breakdown of the gate oxide film 9 and reduction of reliability thereof.

Due to electric field concentration, further, a channel is formed on the peripheral edge portion of the SOI layer 3 located under the gate electrode 10 with a lower voltage than that in the remaining portion of the SOI layer 3 to feed a current, and the MOS transistor may be partially turned on at the peripheral edge portion of the SOI layer 3. This MOS transistor is referred to as a parasitic MOS transistor. The parasitic MOS transistor may be turned on with a gate voltage not turning on the essential MOS transistor, to disadvantageously result in unnecessary power consumption.

SUMMARY OF THE INVENTION

According to a first aspect of the present invention, a method of fabricating a semiconductor device formed on an SOI substrate prepared by stacking a buried oxide film and an SOI layer on a silicon substrate comprises the steps of (a) forming a first oxide film on the SOI substrate by thermal oxidation, (b) successively forming a polysilicon film and a nitride film on the first oxide film, (c) selectively removing the nitride film and thereafter selectively removing the polysilicon film with the rest of the nitride film as a mask to form a laminated structure of a polysilicon film and a nitride film on the first oxide film, (d) forming side wall oxide films over side surfaces of the laminated structure and an upper portion of the first oxide film around the laminated structure, (e) selectively removing the SOI layer with the side wall oxide films and the laminated structure as a mask to define an active region and forming a structural body by the active region, the first oxide film, the laminated structure and the side wall oxide films, (f) filling up the structural body with an isolation oxide film, with an upper major surface of the nitride film exposed, (g) removing the laminated structure, and (h) isotropically removing at least the side wall oxide films, the first oxide film and the isolation oxide film until exposing an upper major surface of the active region.

The method of fabricating a semiconductor device according to the first aspect of the present invention is adapted to form the polysilicon film having a large etching selection ratio with respect to an oxide film on the first oxide film, thereby preventing removal of the first oxide film in patterning of the polysilicon film. Then, the side wall oxide films, the first oxide film and the isolation oxide film are removed while leaving the first oxide film on the overall surface of the active region, whereby the first oxide film which is a thermal oxide film remains even if the side wall oxide films are removed faster due to difference between the etching rates, not to facilitate removal of the isolation oxide film in the vicinity of peripheral edge portions of the active region dissimilarly to such case that no oxide film is left on the peripheral edge portions of the active region. Thus, no depression or the like is formed on the isolation oxide film in the vicinity of the peripheral edge portions of the active region. Therefore, while a gate oxide film is formed on the active region and a gate electrode is formed over the active region and the isolation oxide film located around the same in case of forming a MOS transistor on the active region, for example, no such phenomenon that an electric field applied from the gate electrode located in a depression increases the field strength of the gate oxide film on the peripheral edge portions of the active region since no depression is formed on the isolation oxide film in the vicinity of the peripheral edge portions of the active region. Thus, it is possible to obtain a MOS transistor which is improved in reliability for the gate oxide film while preventing the gate oxide film from dielectric breakdown resulting from field concentration. Further, the gate oxide film is prevented from field concentration on the peripheral edge portions of the active region, whereby no parasitic MOS transistors are formed on the peripheral edge portions of the active region. Thus, it is possible to overcome such a problem that parasitic MOS transistors are turned on with a gate voltage not turning on the original MOS transistor to result in unnecessary power consumption.

According to a second aspect of the present invention, the method of fabricating a semiconductor device further comprises a step of oxidizing the structural body by thermal oxidation for forming second oxide films on side surfaces of the polysilicon film which are in contact with the side wall oxide films in advance of the step (f), and the step (h) includes a step of removing the second oxide films as well.

The method of fabricating a semiconductor device according to the second aspect of the present invention is adapted to form the polysilicon film having a large etching selection ratio with respect to an oxide film on the first oxide film, whereby the first oxide film is prevented from removal in patterning of the polysilicon film and remains on the overall surface of the active region. Further, the side wall oxide films, the first oxide film and the isolation oxide film are removed in such a state that the second oxide films are present under inner walls of the side wall oxide films to substantially increase the thickness of lower portions of the side wall oxide films, whereby the rates for removing the side wall oxide films and the first oxide film are so balanced that the side wall oxide films are not removed too fast. In addition, the first oxide film which is a thermal oxide film remains after removal of the side wall oxide films not to facilitate removal of the isolation oxide film in the vicinity of the peripheral edge portions of the active region dissimilarly to such case that no oxide film is left on the peripheral edge portions of the active region, whereby no depression or the like is formed on the isolation oxide film in the vicinity of the peripheral edge portions of the active region.

According to a third aspect of the present invention, the method of fabricating a semiconductor device further comprises a step of oxidizing the laminated structure and the first oxide film by thermal oxidation for forming second oxide films on side surfaces of the polysilicon film while increasing the thickness of the first oxide film around the laminated structure in advance of the step (d), the step (d) includes a step of forming the side wall oxide films over the side surfaces of the laminated structure and the first oxide film which is increased in thickness, and the step (h) includes a step of removing the second oxide films as well.

The method of fabricating a semiconductor device according to the third aspect of the present invention is adapted to form the polysilicon film having a large etching selection ratio with respect to an oxide film on the first oxide film, whereby the first oxide film is prevented from removal in patterning of the polysilicon film and remains on the overall surface of the active region. Further, the second oxide films are present under the inner walls of the side wall oxide films while the first oxide film which is increased in thickness remains on the peripheral edge portions of the active region, to substantially increase the thickness of the lower portions of the side wall oxide films. The side wall oxide films, the first oxide film and the isolation oxide film are removed in this state, whereby the rates for removing the side wall oxide films and the first oxide film are so balanced that the side wall oxide films are not removed too fast. In addition, the first oxide film which is a thermal oxide film and increased in thickness remains after removal of the side wall oxide films not to facilitate removal of the isolation oxide film in the vicinity of the peripheral edge portions of the active region dissimilarly to such case that no oxide film is left on the peripheral edge portions of the active region, whereby no depression or the like is formed on the isolation oxide film in the vicinity of the peripheral edge portions of the active region.

An object of the present invention is to provide a method of fabricating an SOIMOS transistor, isolated by trench isolation, which can prevent a gate oxide film from dielectric breakdown on peripheral edge portions of an SOI layer while preventing formation of parasitic MOS transistors on the peripheral edge portions of the SOI layer under the gate electrode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<A. Embodiment 1>

A method of fabricating an SOIMOS transistor 100 formed on an SOI substrate and isolated by trench isolation according to an embodiment 1 of the present invention is now described with reference to FIGS. 1 to 10 successively showing fabrication steps. The structure of the SOIMOS transistor 100 is shown in FIG. 10 illustrating the final step.

<A-1. Fabrication Method>

Figure 1:
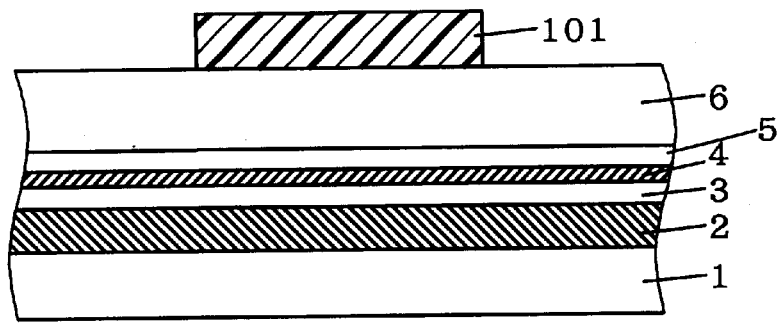
FIGS. 1 to 10 illustrate steps of fabricating a semiconductor device according to an embodiment 1 of the present invention.

First, an SOI substrate formed by a silicon substrate 1, a buried oxide film 2 buried in the silicon substrate 1 and an SOI layer 3 formed on the buried oxide film 2 is prepared, for forming a pad oxide film 4 (first oxide film) of about 100 to 300 Å in thickness on the SOI layer 3 by thermal oxidation and depositing a polysilicon film 5 of about 500 Å in thickness further thereon by CVD, as shown in FIG. 1. A nitride film 6 of about 1000 to 3000 Å in thickness is formed on the polysilicon film 5 by CVD under a temperature condition of about 700° C. Further, a resist film 101 is patterned on the nitride film 6 to correspond to a portion defining an active region described later. The SOI substrate may be formed by SIMOX (separation by implanted oxygen), wafer bonding or any other method.

Figure 2:
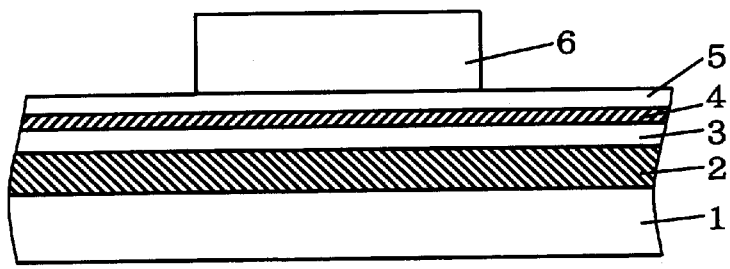

Then, the nitride film 6 is selectively removed by anisotropic dry etching with the resist film 101 employed as a mask, as shown in FIG. 2.

Figure 3:
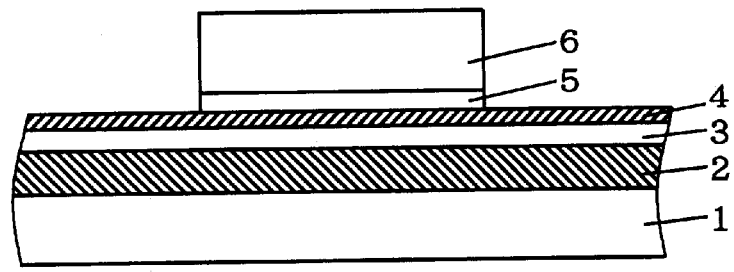

Then, the polysilicon film 5 is selectively removed by anisotropic etching such as RIE (reactive ion etching) with the nitride film 6 employed as a mask, thereby obtaining a laminated structure of the nitride 6 and the polysilicon film 5, as shown in FIG. 3. Etching conditions for the polysilicon film 5 and the pad oxide film 4 are so remarkably different from each other that the pad oxide film 4 is hardly etched under the conditions for etching the polysilicon film 5, and the selection ratio is at least 10.

Figure 4:
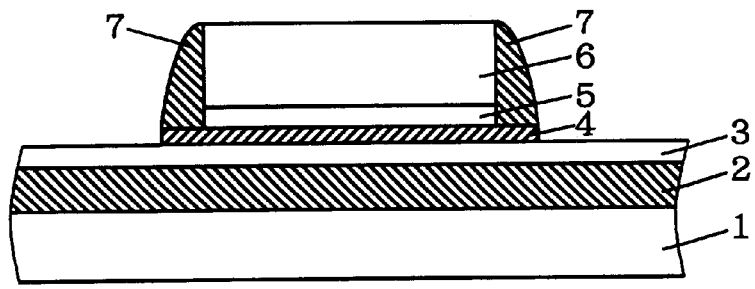

Then, an oxide film of about 500 Å in thickness is formed on the overall surface by CVD employing TEOS (tetraethyl orthosilicate) and anisotropically etched to remain on side surfaces of the nitride film 6 and the polysilicon film 5 in self alignment as side wall oxide films 7, thereby obtaining the structure shown in FIG. 4.

Figure 5:
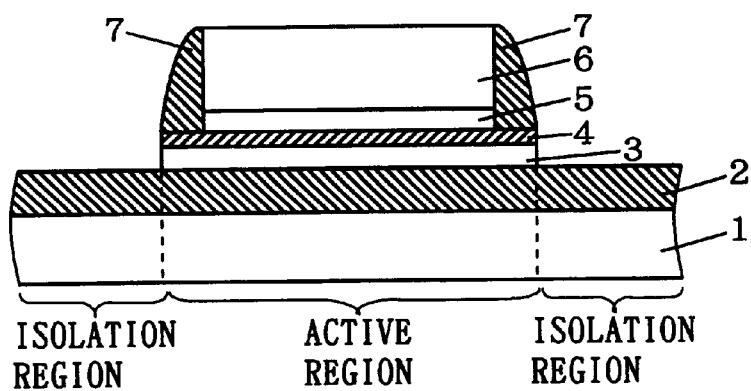

Then, the SOI layer 3 is selectively removed by anisotropic dry etching with the nitride film 6 and the side wall oxide films 7 employed as masks thereby obtaining a structural body formed by the nitride film 6, the polysilicon layer 5, the pad oxide film 4, the side wall oxide films 7 and the SOI layer 3, as shown in FIG. 5. The selectively obtained SOI layer 3, defining a region for forming the semiconductor device in a step described later, is referred to as an active region, while the regions around this active region for electrical isolation from other active regions are referred to as isolation regions. The SOI layer 3 has a rectangular plane shape with vertical and transverse sides of similar lengths.

Figure 6:
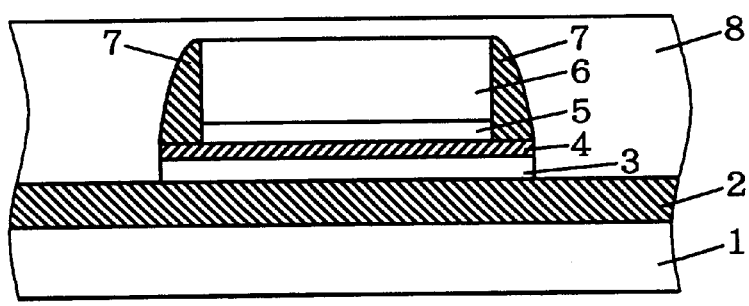

Then, a deposition oxide film 8 (isolation oxide film) having a thickness (e.g., about 5000 Å) larger than the total thickness of the SOI layer 3, the pad oxide film 4, the polysilicon film 5 and the nitride film 6 is formed on the overall surface by CVD to cover the active region and the isolation regions as shown in FIG. 6, and thereafter polished and planarized by CMP until exposing the nitride film 6. FIG. 6 shows an intermediate stage of the step of planarizing the deposition oxide film 8.

Figure 7:
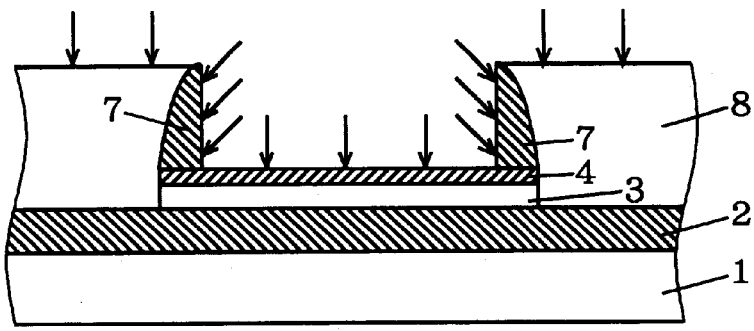

Then, the nitride film 6 is removed with phosphoric acid of about 160° C. in temperature and thereafter the polysilicon film 5 is removed by isotropic dry etching such as plasma etching or downflow etching, thereby leaving the pad oxide film 4 and the side wall oxide films 7 in a state enclosed with the deposition oxide film 8 as shown in FIG. 7. The nitride film 6 is removed with phosphoric acid and the polysilicon film 5 is removed by isotropic dry etching for the following reason: If side surfaces of the nitride film 6 and the polysilicon film 5 are not vertically formed but inclined to widen downward, inner walls of the side wall oxide films 7 which are in contact therewith are also inclined and the nitride film 6 and the polysilicon film 5 disadvantageously remain in the vicinity of the inner walls of the side wall oxide films 7 if anisotropic dry etching is employed.

An impurity is injected into the SOI layer 3 through the pad oxide film 4 for channel injection (channel doping), and thereafter the pad oxide film 4 is removed with hydrofluoric acid.

Referring to FIG. 7, the pad oxide film 4, the side wall oxide films 7 and the deposition oxide film 8 are simultaneously removed by the hydrofluoric acid as shown by arrows.

Alternatively, the pad oxide film 4, the side wall oxide films 7 and the deposition oxide film 8 may be removed by isotropic dry etching in place of wet etching with the hydrofluoric acid.

Figure 8:
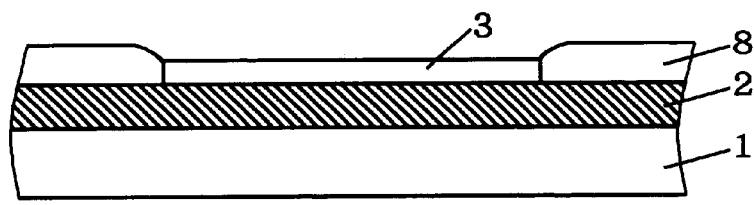
Figure 36:
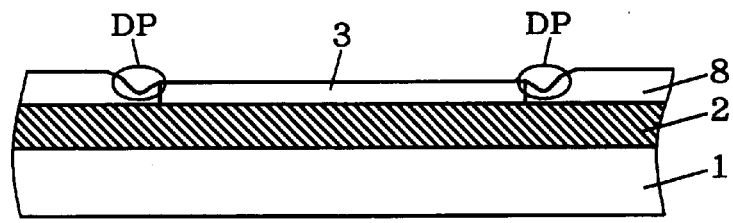
Figure 37:
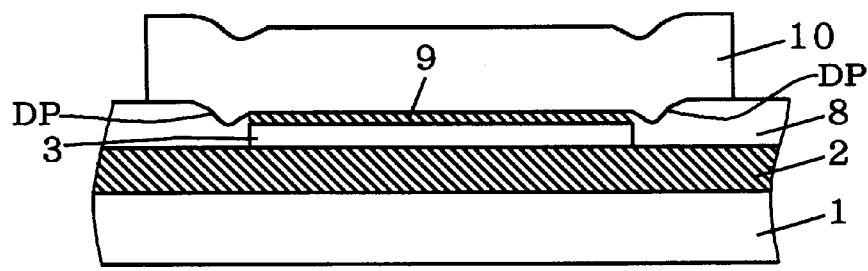
Figure 38:
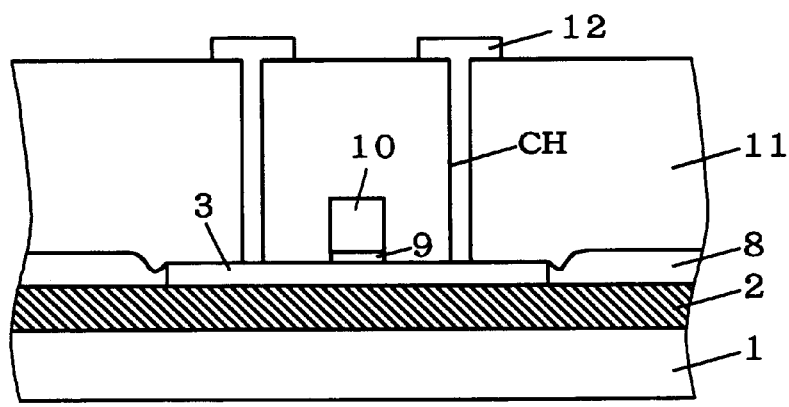
Figure 39:
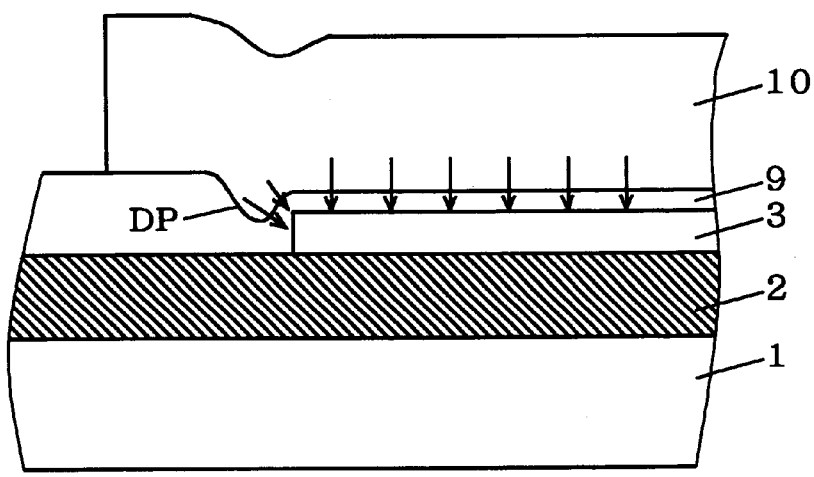
FIG. 39 illustrates problems in the method of fabricating the conventional semiconductor device.

FIG. 8 shows such a state that the pad oxide film 4 is completely removed. As shown in FIG. 8, no depression parts such as those shown in FIG. 36 or the like are formed on the deposition oxide film 8 in the vicinity of the peripheral edge portions of the SOI layer 3. The pad oxide film 4, which is a thermal oxide film formed on the overall surface of the SOI layer 3, remains even if the side wall oxide films 7 which are TEOS oxide films are removed with the hydrofluoric acid faster, not to facilitate removal of the deposition oxide film 8 in the vicinity of the peripheral edge portions of the SOI layer 3 dissimilarly to such case that no oxide film is left on the peripheral edge portions of the SOI layer 3.

Figure 9:
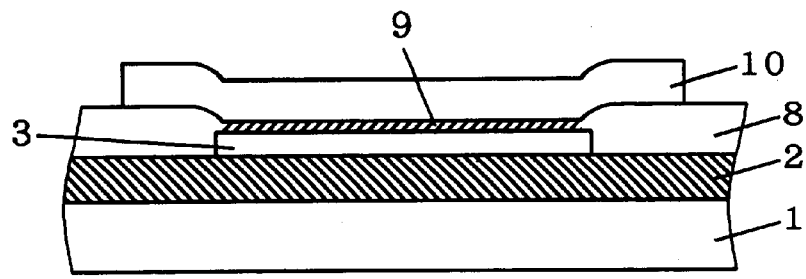
Figure 10:
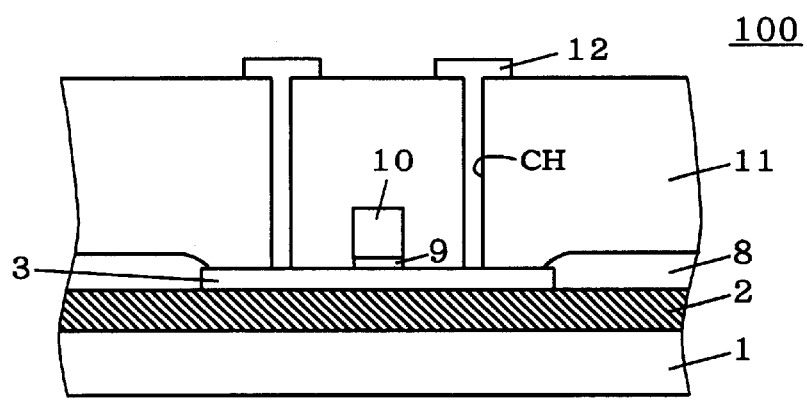

Then, a gate oxide film 9 of about 70 Å in thickness is formed on the SOI layer 3, and thereafter a gate electrode 10 of about 2000 Å in thickness is formed on the gate oxide film 9 and the deposition oxide film 8 with a conductor such as polysilicon, as shown in FIG. 9.

Thereafter the gate electrode 10 is patterned. Then, an impurity is injected into the SOI layer 3 with the patterned gate electrode 10 employed as a mask to form source/drain regions (not shown) in self alignment, parts of the gate oxide film 9 are removed except that located under the gate electrode 10, and thereafter an interlayer insulating film 11 is formed on the overall surface. Contact holes CH are formed to reach the gate electrode 10 and the source/drain regions through the interlayer insulating film 11 and conductor layers are buried in the contact holes CH for forming wiring layers 12, thereby obtaining the SOIMOS transistor 100 shown in FIG. 10. FIG. 10 is a sectional view of the SOIMOS transistor 100 as viewed from a shorter side of the gate electrode 10, while FIGS. 1 to 9 are sectional views as viewed from a longer side of the gate electrode 10.

<A-2. Characteristic Function/Effect>

In the method of fabricating the SOIMOS transistor 100, as hereinabove described, the polysilicon film 5 having a large etching selection ratio for an oxide film is formed on the pad oxide film 4, thereby preventing removal of the pad oxide film 4 in patterning of the polysilicon film 5. Then, the side wall oxide films 7, the pad oxide film 4 and the deposition oxide film 8 are removed while leaving the pad oxide film 4 on the overall surface of the SOI layer 3, whereby the pad oxide film 4 which is a thermal oxide film remains even if the side wall oxide films 7 are removed faster due to difference between the etching rates, not to facilitate removal of the deposition oxide film 8 in the vicinity of peripheral edge portions of the SOI layer 3 dissimilarly to such case that no oxide film is left on the peripheral edge portions of the SOI layer 3. Thus, no depression or the like is formed on the deposition oxide film 8 in the vicinity of the peripheral edge portions of the SOI layer 3. Therefore, no such phenomenon that an electric field applied from the gate electrode 10 located in a depression increases the electric field strength of the gate oxide film 9 on the peripheral edge portions of the SOI layer 3, whereby the gate oxide film 9 is prevented from dielectric breakdown resulting from electric field concentration and it is possible to obtain the SOIMOS transistor 100 which is improved in reliability for the gate oxide film 9.

Further, the gate oxide film 9 is prevented from electric field concentration on the peripheral edge portions of the SOI layer 3, whereby no parasitic MOS transistors are formed on the peripheral edge portions of the SOI layer 3. Thus, it is possible to overcome such a problem that parasitic MOS transistors are turned on with a gate voltage not turning on the original MOS transistor to result in unnecessary power consumption.

<B. Embodiment 2>

A method of fabricating an SOIMOS transistor 200 formed on an SOI substrate and isolated by trench isolation according to an embodiment 2 of the present invention is now described with reference to FIGS. 11 to 18 successively showing fabrication steps. The structure of the SOIMOS transistor 200 is shown in FIG. 18 illustrating the final step.

<B-1. Fabrication Method and Device Structure>

Figure 11:
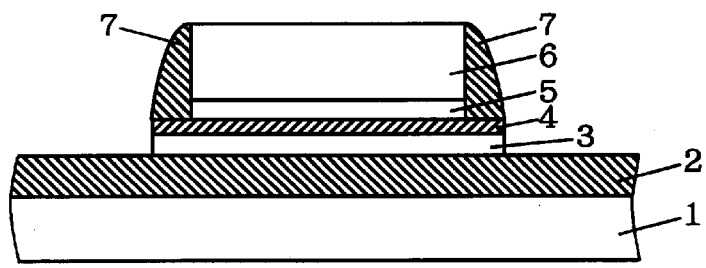
FIGS. 11 to 18 illustrate steps of fabricating a semiconductor device according to an embodiment 2 of the present invention.

Steps up to formation of the structure shown in FIG. 11 are identical to those of the embodiment 1 described with reference to FIGS. 1 to 4, and hence redundant description is omitted. As shown in FIG. 11, a nitride film 6 and side wall oxide films 7 are employed as masks for selectively removing an SOI layer 3 by anisotropic dry etching, thereby obtaining a structural body formed by the nitride film 6, a polysilicon layer 5, a pad oxide film 4, the side wall oxide films 7 and the SOI layer 3. The subsequent steps are now described with reference to FIGS. 12 to 18.

Figure 12:
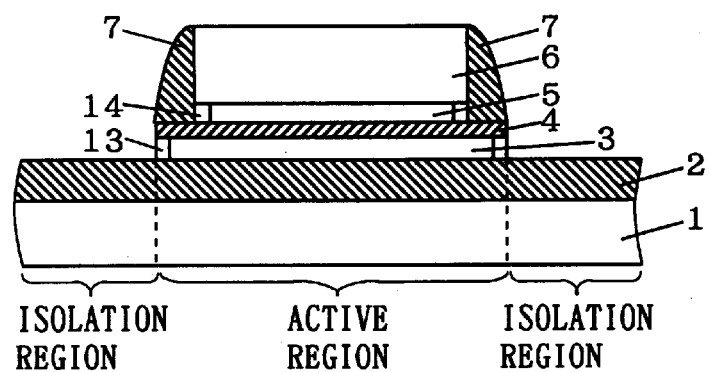

After obtaining the structural body shown in FIG. 11, oxide films 14 (second oxide films) are formed on side surfaces of the polysilicon film 5 by thermally oxidizing the structural body, thereby obtaining the structure shown in FIG. 12. While the side surfaces of the polysilicon film 5 are covered with the side wall oxide films 7, oxygen serving as an oxidizer infiltrates into these side surfaces during thermal oxidation, thereby forming the oxide films 14. In formation of the oxide films 14, oxide films 13 are formed on side surfaces of the SOI layer 3. The oxide films 13 and 14 are about 300 Å in thickness.

Figure 13:
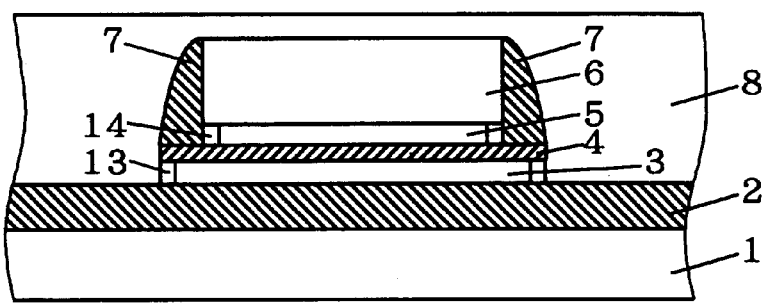

Then, a deposition oxide film 8 (isolation oxide film) having a thickness (e.g., about 5000 Å) larger than the total thickness of the SOI layer 3, the pad oxide film 4, the polysilicon film 5 and the nitride film 6 is formed on the overall surface by CVD to cover active and isolation regions as shown in FIG. 13, and thereafter is polished and planarized by CMP until exposing the nitride film 6. FIG. 13 shows an intermediate stage of the step of planarizing the deposition oxide film 8.

Figure 14:
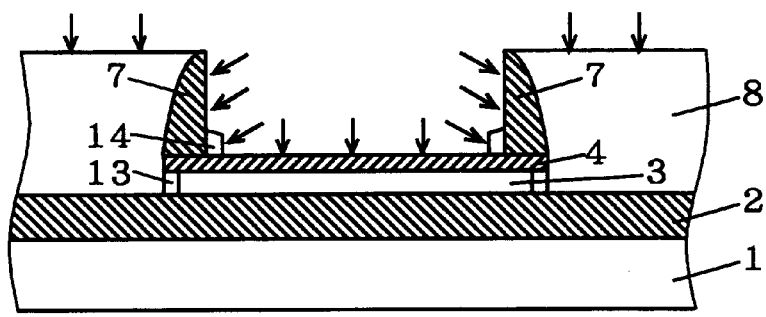

Then, the nitride film 6 is removed with phosphoric acid of about 160° C. in temperature and thereafter the polysilicon film 5 is removed by isotropic dry etching such as plasma etching or downflow etching, thereby leaving the pad oxide film 4 and the side wall oxide films 7 in a state enclosed with the deposition oxide film 8 as shown in FIG. 14. The oxide films 14 remain under inner walls of the side wall oxide films 7.

An impurity is injected into the SOI layer 3 through the pad oxide film 4 for channel injection (channel doping), and thereafter the pad oxide film 4 is removed with hydrofluoric acid. Alternatively, the pad oxide film 4, the side wall oxide films 7, the deposition oxide film 8 and the oxide films 14 may be removed by isotropic dry etching in place of wet etching with the hydrofluoric acid. Referring to FIG. 14, the pad oxide film 4, the side wall oxide films 7, the deposition oxide film 8 and the oxide films 14 are simultaneously removed by the hydrofluoric acid as shown by arrows.

Figure 15:
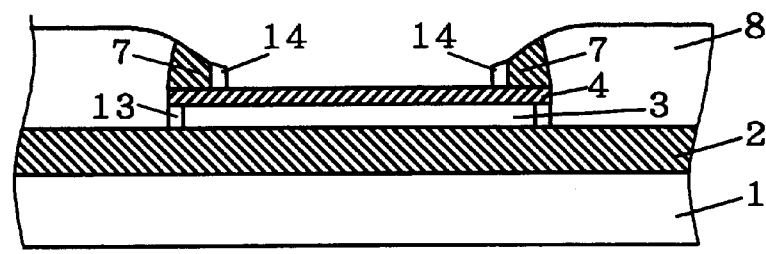
Figure 16:
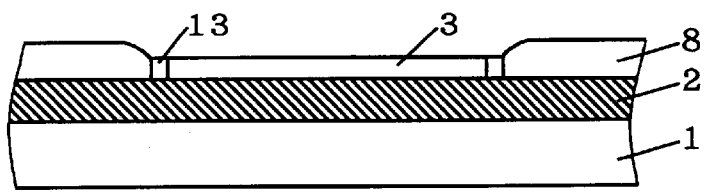

FIG. 15 shows the pad oxide film 4 not yet completely removed, and FIG. 16 shows a state after complete removal of the pad oxide film 4. As shown in FIG. 16, no depression parts such as those shown in FIG. 36 or the like are formed on the deposition oxide film 8 in the vicinity of peripheral edge portions of the SOI layer 3, since the pad oxide film 4 is formed on the overall surface of the SOI layer 3 and the oxide films 14 present under the inner walls of the side wall oxide films 7 for substantially increasing the thickness of lower portions of the side wall oxide films 7. The lower portions of the side wall oxide films 7 are thus increased in thickness, whereby the rates for removing the side wall oxide films 7 and the pad oxide film 4 are so balanced that the side wall oxide films 7 are not removed too fast. In addition, the pad oxide film 4 which is a thermal oxide film remains after removal of the side wall oxide films 7 not to facilitate removal of the deposition oxide film 8 in the vicinity of the peripheral edge portions of the SOI layer 3, dissimilarly to such case that no oxide film is left on the peripheral edge portions of the SOI layer 3.

Figure 17:
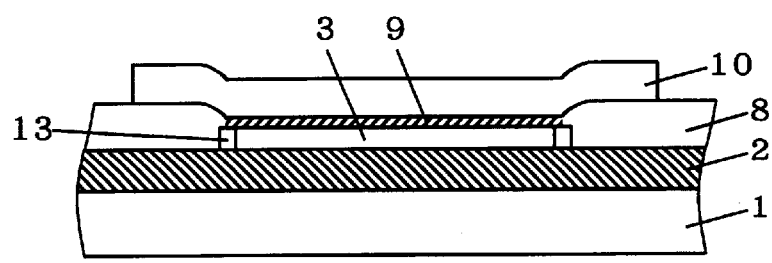
Figure 18:
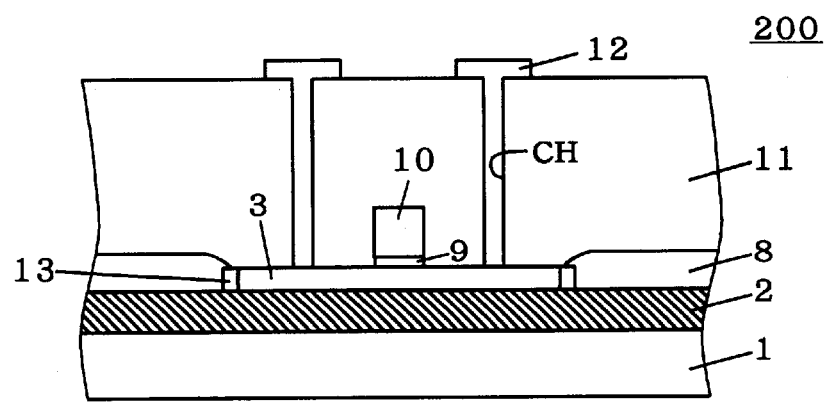

Then, a gate oxide film 9 of about 70 Å in thickness is formed on the SOI layer 3, and a gate electrode 10 of about 2000 Å in thickness is formed on the gate oxide film 9 and the deposition oxide film 8 with a conductor such as polysilicon, as shown in FIG. 17.

Thereafter the gate electrode 10 is patterned. Then, an impurity is injected into the SOI layer 3 with the patterned gate electrode 10 employed as a mask to form source/drain regions (not shown) in self alignment, parts of the gate oxide film 9 are removed except that located under the gate electrode 10, and thereafter an interlayer insulating film 11 is formed on the overall surface. Contact holes CH are formed to reach the gate electrode 10 and the source/drain regions through the interlayer insulating film 11 and conductor layers are buried in the contact holes CH for forming wiring layers 12, thereby obtaining the SOIMOS transistor 200 shown in FIG. 18. FIG. 18 is a sectional view of the SOIMOS transistor 200 as viewed from a shorter side of the gate electrode 10, while FIGS. 11 to 17 are sectional views as viewed from a longer side of the gate electrode 10.

<B-2. Characteristic Function/Effect>

In the method of fabricating the SOIMOS transistor 200, as hereinabove described, the polysilicon film 5 having a large etching selection ratio for an oxide film is formed on the pad oxide film 4, thereby preventing removal of the pad oxide film 4 in patterning of the polysilicon film 5. Then, the side wall oxide films 7, the pad oxide film 4 and the deposition oxide film 8 are removed while the pad oxide film 4 remains on the overall surface of the SOI layer 3 and the oxide films 14 are present on the lower portions of the inner walls of the side wall oxide films 7 to substantially increase the thickness of the lower portions of the side wall oxide films 7, whereby the rates for removing the side wall oxide films 7 and the pad oxide film 4 are so balanced that the side wall oxide films 7 are not removed too fast. Further, the pad oxide film 4 which is a thermal oxide film remains after removal of the side wall oxide films 7, not to facilitate removal of the deposition oxide film 8 in the vicinity of peripheral edge portions of the SOI layer 3 dissimilarly to such case that no oxide film is left on the peripheral edge portions of the SOI layer 3. Thus, no depression or the like is formed on the deposition oxide film 8 in the vicinity of the peripheral edge portions of the SOI layer 3. Therefore, no such phenomenon that an electric field applied from the gate electrode 10 located in a depression increases the electric field strength of the gate oxide film 9 on the peripheral edge portions of the SOI layer 3, whereby the gate oxide film 9 is prevented from dielectric breakdown resulting from electric field concentration and it is possible to obtain the SOIMOS transistor 200 which is improved in reliability for the gate oxide film 9.

Further, the gate oxide film 9 is prevented from electric field concentration on the peripheral edge portions of the SOI layer 3, whereby no parasitic MOS transistors are formed on the peripheral edge portions of the SOI layer 3. Thus, it is possible to overcome such a problem that parasitic MOS transistors are turned on with a gate voltage not turning on the original MOS transistor to result in unnecessary power consumption.

<C. Embodiment 3>

A method of fabricating an SOIMOS transistor 300 formed on an SOI substrate and isolated by trench isolation according to an embodiment 3 of the present invention is now described with reference to FIGS. 19 to 28 successively showing fabrication steps. The structure of the SOIMOS transistor 300 is shown in FIG. 28 illustrating the final step.

<C-1. Fabrication Method>

Figure 19:
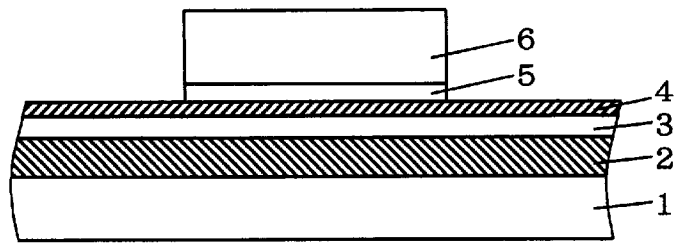
FIGS. 19 to 28 illustrate steps of fabricating a semiconductor device according to an embodiment 3 of the present invention.

Steps up to formation of the structure shown in FIG. 19 are identical to those of the embodiment 1 described with reference to FIGS. 1 and 2, and hence redundant description is omitted. As shown in FIG. 19, a nitride film 6 is employed as a mask for selectively removing a polysilicon film 5 by anisotropic dry etching such as RIE, thereby obtaining a laminated structure of the nitride film 6 and the polysilicon film 5. The subsequent steps are now described with reference to FIGS. 20 to 28.

Figure 20:
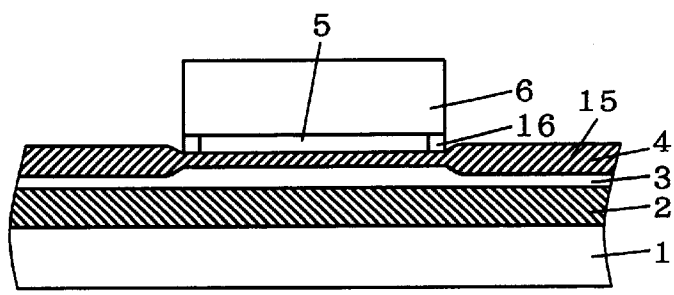

After obtaining the structure shown in FIG. 19, parts of a pad oxide film 4 other than that located under the polysilicon film 5 are further grown by thermal oxidation for obtaining oxide films 15 (first oxide films increased in thickness) of about 200 to 500 Å in thickness while forming oxide films 16 (second oxide films) of about 200 to 500 Å in thickness on side surfaces of the polysilicon film 5, thereby obtaining the structure shown in FIG. 20.

Figure 21:
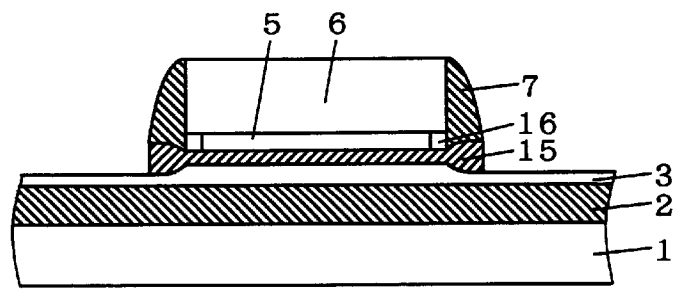

Then, an oxide film of about 500 Å in thickness is formed on the overall surface by CVD with TEOS, and anisotropic etching is so performed that this oxide film remains as side wall oxide films 7 on side surfaces of the nitride film 6 and the oxide films 16 in self alignment, thereby obtaining the structure shown in FIG. 21.

Figure 22:
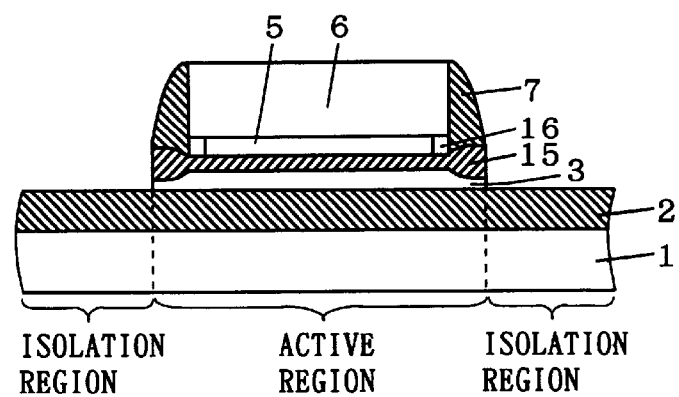

Then, the nitride film 6 and the side wall oxide films 7 are employed as masks for selectively removing an SOI layer 3 by anisotropic dry etching, thereby obtaining a structural body formed by the nitride film 6, the polysilicon layer 5, the pad oxide film 4, the side wall oxide films 7, the oxide films 15 and the SOI layer 3 as shown in FIG. 22. The selectively obtained SOI layer 3, defining a region for forming a semiconductor device in a step described later, is referred to as an active region, while the regions around this active region for electric isolation from other active regions are referred to as isolation regions. The SOI layer 3 has a rectangular plane shape with vertical and transverse sides of similar lengths.

Figure 23:
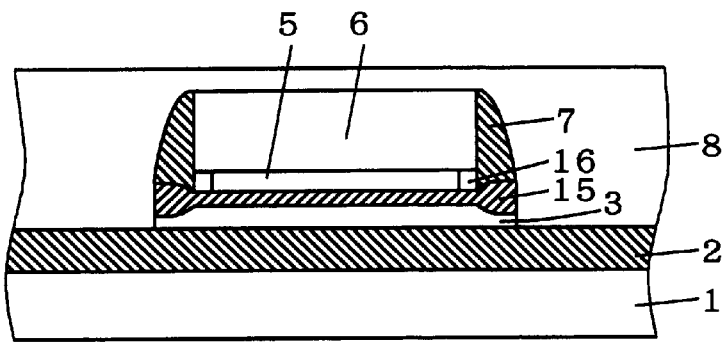

Then, a deposition oxide film 8 (isolation oxide film) having a thickness (e.g., about 5000 Å) larger than the total thickness of the SOI layer 3, the pad oxide film 4, the polysilicon film 5 and the nitride film 6 is formed on the overall surface by CVD to cover the active and isolation regions as shown in FIG. 23, and thereafter polished and planarized by CMP until exposing the nitride film 6. FIG. 23 shows an intermediate stage of the step of planarizing the deposition oxide film 8.

Figure 24:
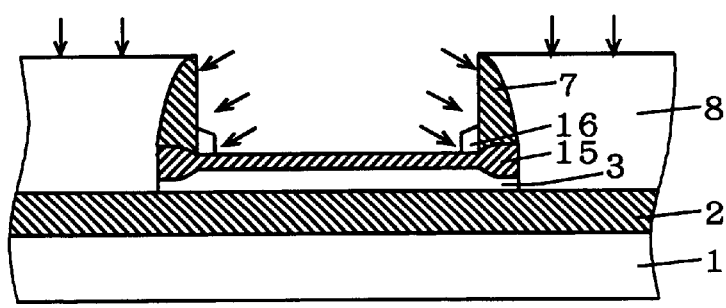

Then, the nitride film 6 is removed with phosphoric acid of about 160° C. in temperature and thereafter the polysilicon film 5 is removed by isotropic dry etching such as plasma etching or downflow etching, thereby leaving the pad oxide film 4 and the side wall oxide films 7 in a state enclosed with the deposition oxide film 8 as shown in FIG. 24. The oxide films 16 remain under inner walls of the side wall oxide films 7, while the oxide films 15 remain on the peripheral edge portions of the SOI layer 3.

An impurity is injected into the SOI layer 3 through the pad oxide film 4 for channel doping, and thereafter the pad oxide film 4 is removed with hydrofluoric acid. Alternatively, the pad oxide film 4, the side wall oxide films 7, the deposition oxide film 8 and the oxide films 16 may be removed by isotropic dry etching in place of wet etching with the hydrofluoric acid. Referring to FIG. 24, the pad oxide film 4, the side wall oxide films 7, the deposition oxide film 8 and the oxide films 16 are simultaneously removed by the hydrofluoric acid as shown by arrows.

Figure 25:
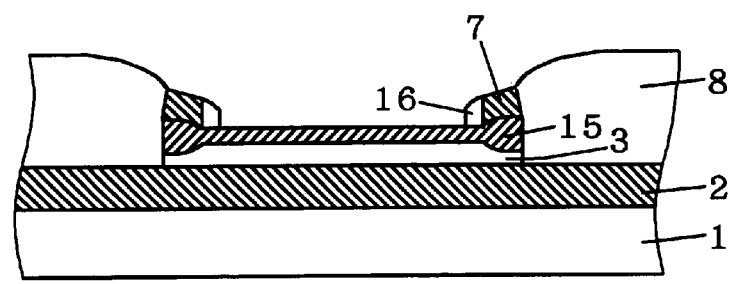
Figure 26:
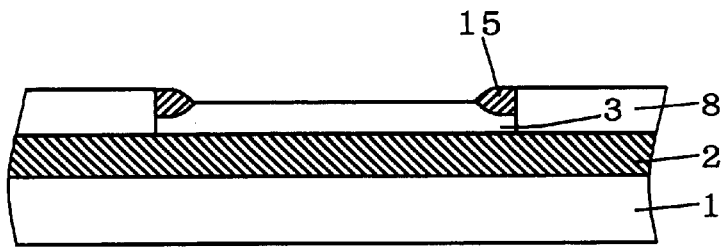

FIG. 25 shows the pad oxide film 4 not yet completely removed, and FIG. 26 shows a state after complete removal of the pad oxide film 4. As shown in FIG. 26, the oxide films 15 remain on the peripheral edge portions of the SOI layer 3 and no depression parts such as those shown in FIG. 36 or the like are formed on the deposition oxide film 8 in the vicinity of peripheral edge portions of the SOI layer 3, since the pad oxide film 4 is formed on the overall surface of the SOI layer 3 and the oxide films 15 larger than the pad oxide film 4 in thickness are formed on the peripheral edge portions of the SOI layer 3 in particular and the oxide films 16 are present under inner walls of the side wall oxide films 7 for substantially increasing the thickness of the lower portions of the side wall oxide films 7. The lower portions of the side wall oxide films 7 are thus increased in thickness, whereby the rates for removing the side wall oxide films 7 and the pad oxide film 4 are so balanced that the side wall oxide films 7 are not removed too fast. In addition, the oxide films 15 which are thermal oxide films remain on the peripheral edge portions of the SOI layer 3 after removal of the side wall oxide films 7 not to facilitate removal of the deposition oxide film 8 in the vicinity of the peripheral edge portions of the SOI layer 3 dissimilarly to such case that no oxide films are left on the peripheral edge portions of the SOI layer 3. While the oxide films 15 larger in thickness than the pad oxide film 4 may slightly remain after removal of the pad oxide film 4, such remaining parts exert no bad influence on the device operation.

Figure 27:
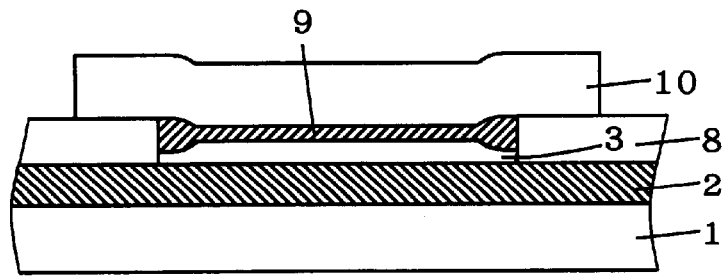
Figure 28:
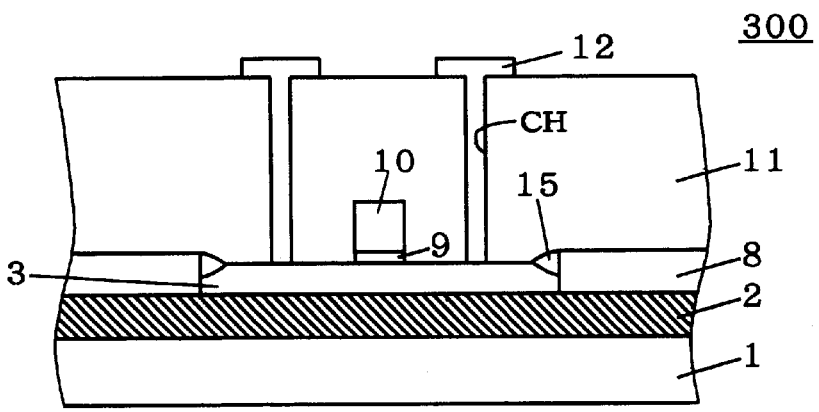
Figure 29:
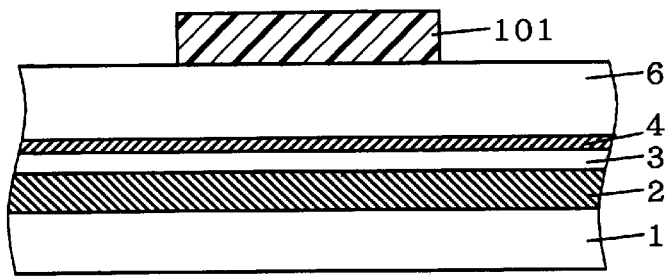
FIGS. 29 to 38 illustrate steps of fabricating a conventional semiconductor device.
Figure 30:
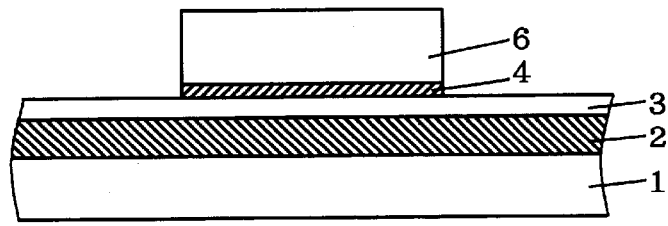
Figure 31:
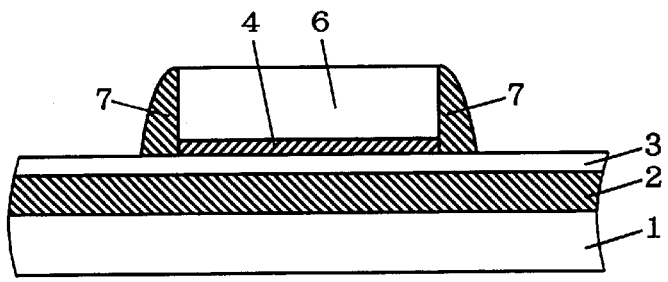
Figure 32:
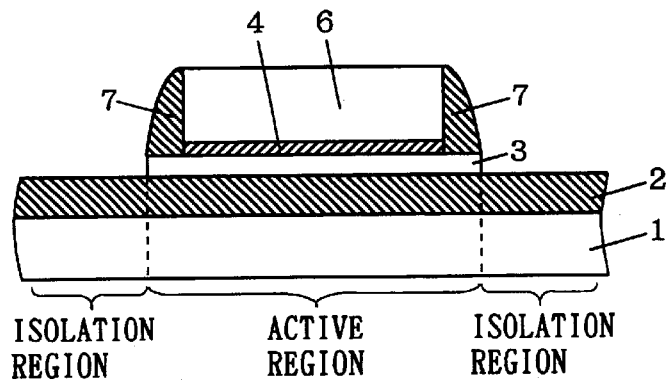
Figure 33:
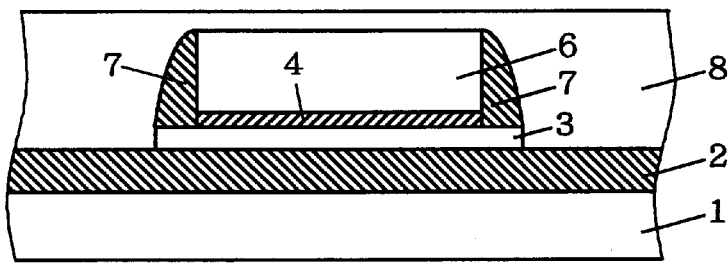
Figure 34:
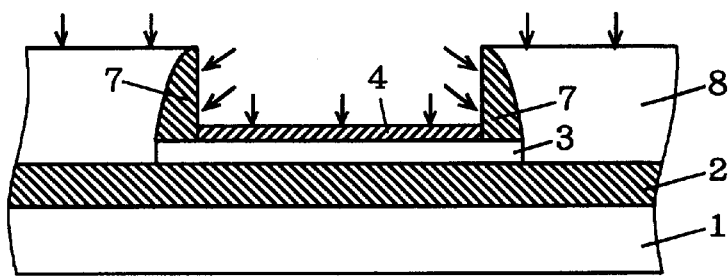
Figure 35:
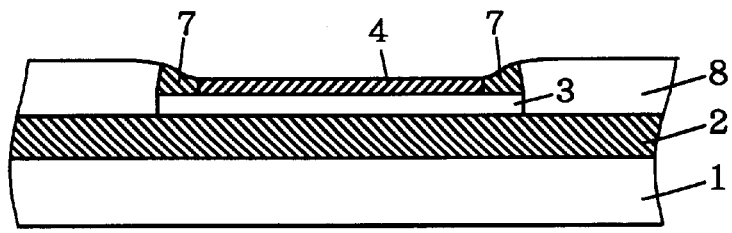

Then, a gate oxide film 9 of about 70 Å in thickness is formed on the SOI layer 3, and a gate electrode 10 of about 2000 Å in thickness is formed on the gate oxide film 9 and the deposition oxide film 8 with a conductor such as polysilicon, as shown in FIG. 27.

Thereafter the gate electrode 10 is patterned. Then, an impurity is injected into the SOI layer 3 with the patterned gate electrode 10 employed as a mask to form source/drain regions (not shown) in self alignment, parts of the gate oxide film 9 are removed except that located under the gate electrode 10, and thereafter an interlayer insulating film 11 is formed on the overall surface. Contact holes CH are formed to reach the gate electrode 10 and the source/drain regions through the interlayer insulating film 11 and conductor layers are buried in the contact holes CH for forming wiring layers 12, thereby obtaining the SOIMOS transistor 300 shown in FIG. 28. FIG. 28 is a sectional view of the SOIMOS transistor 300 as viewed from a shorter side of the gate electrode 10, while FIGS. 19 to 27 are sectional views as viewed from a longer side of the gate electrode 10.

<C-2. Characteristic Function/Effect>

In the method fabricating the SOIMOS transistor 300, as hereinabove described, the polysilicon film 5 having a large etching selection ratio for an oxide film is formed on the pad oxide film 4, thereby preventing removal of the pad oxide film 4 in patterning of the polysilicon film 5 so that the pad oxide film 4 remains on the overall surface of the SOI layer 3. Further, the oxide films 16 are present under the inner walls of the side wall oxide films 7 while the oxide films 15 larger in thickness than the pad oxide film 4 remain on the peripheral edge portions of the SOI layer 3, thereby substantially increasing the thickness of the lower portions of the side wall oxide films 7. The side wall oxide films 7, the pad oxide film 4 and the deposition oxide film 8 are removed in this state, whereby the rates for removing the side wall oxide films 7 and the pad oxide film 4 are so balanced that the side wall oxide films 7 are not removed too fast. Further, the pad oxide film 4 and the oxide films 15 which are thermal oxide films remain after removal of the side wall oxide films 7, not to facilitate removal of the deposition oxide film 8 in the vicinity of the peripheral edge portions of the SOI layer 3 dissimilarly to such case that no oxide film is left on the peripheral edge portions of the SOI layer 3. Thus, no depression or the like is formed on the deposition oxide film 8 in the vicinity of the peripheral edge portions of the SOI layer 3. Therefore, no such phenomenon that an electric field applied from the gate electrode 10 located in a depression increases the electric field strength of the gate oxide film 9 on the peripheral edge portions of the SOI layer 3, whereby the gate oxide film 9 is prevented from dielectric breakdown resulting from field concentration and it is possible to obtain the SOIMOS transistor 300 which is improved in reliability for the gate oxide film 9.

Further, the gate oxide film 9 is prevented from field concentration on the peripheral edge portions of the SOI layer 3, whereby no parasitic MOS transistors are formed on the peripheral edge portions of the SOI layer 3. Thus, it is possible to overcome such a problem that parasitic MOS transistors are turned on with a gate voltage not turning on the essential MOS transistor to result in unnecessary power consumption.

While the invention has been shown and described in detail, the following description is in all aspects illustrative and restrictive. It is therefore understood that numerous modifications and variations can be devised without departing from the scope of the invention.

We claim:

1. A method of fabricating a semiconductor device formed on an SOI substrate prepared by stacking a buried oxide film and an SOI layer on a silicon substrate, comprising the steps of:

(a) forming a first oxide film on said SOI substrate by thermal oxidation;

(b) successively forming a polysilicon film and a nitride film on said first oxide film;

(c) selectively removing said nitride film and thereafter selectively removing said polysilicon film with the rest of said nitride film as a mask to form a laminated structure of a polysilicon film and a nitride film on said first oxide film;

(d) forming side wall oxide films over side surfaces of said laminated structure and an upper portion of said first oxide film around said laminated structure;

(e) selectively removing said SOI layer with said side wall oxide films and said laminated structure as a mask to define an active region and forming a structural body comprising said active region, said first oxide film, said laminated structure and said side wall oxide films;

(f) covering said structural body with an isolation oxide film, with an upper major surface of said nitride film exposed;

(g) removing said laminated structure; and (h) isotropically removing at least said side wall oxide films, said first oxide film and said isolation oxide film until exposing an upper major surface of said active region.

2. The method of fabricating a semiconductor device according to claim 1, wherein said step (g) includes steps of:
        removing said nitride film with phosphoric acid of about 160° C. in temperature, and
        removing said polysilicon film by isotropic dry etching.

3. The method of fabricating a semiconductor device according to claim 1, wherein said step (f) includes a step of:
        completely covering said structural body with said isolation oxide film and thereafter polishing said isolation oxide film by chemical mechanical polishing for exposing said upper major surface of said nitride film.

4. The method of fabricating a semiconductor device according to claim 1, further comprising a step of oxidizing said structural body by thermal oxidation for forming second oxide films on side surfaces of said polysilicon film being in contact with said side wall oxide films in advance of said step (f), said step (h) including a step of:
        removing said second oxide films as well.

5. The method of fabricating a semiconductor device according to claim 4, wherein said step (g) includes steps of:
        removing said nitride film with phosphoric acid of about 160° C. in temperature, and
        removing said polysilicon film by isotropic dry etching.

6. The method of fabricating a semiconductor device according to claim 4, wherein said step (f) includes a step of:
    completely covering said structural body with said isolation oxide film and thereafter polishing said isolation oxide film by chemical mechanical polishing for exposing said upper major surface of said nitride film.

7. The method of fabricating a semiconductor device according to claim 1, further comprising a step of:
    oxidizing said laminated structure and said first oxide film by thermal oxidation for forming second oxide films on side surfaces of said polysilicon film while increasing the thickness of said first oxide film around said laminated structure in advance of said step (d), wherein
said step (d) includes a step of:
    forming said side wall oxide films over said side surfaces of said laminated structure and said first oxide film being increased in thickness, and
said step (h) includes a step of:
    removing said second oxide films as well.

8. The method of fabricating a semiconductor device according to claim 7, wherein
said step (g) includes steps of:
    removing said nitride film with phosphoric acid of about 160° C. in temperature, and
    removing said polysilicon film by isotropic dry etching.

9. The method of fabricating a semiconductor device according to claim 7, wherein
said step (f) includes a step of:
    completely covering said structural body with said isolation oxide film and thereafter polishing said isolation oxide film by chemical mechanical polishing for exposing said upper major surface of said nitride film.

10. A method of fabricating a semiconductor device formed on an SOI substrate prepared by stacking a buried oxide film and an SOI layer on a silicon substrate, comprising the steps of:
    (a) forming a first oxide file on said SOI substrate;
    (b) successively forming a polysilicon film and a nitride film on said first oxide film;
    (c) selectively removing said nitride film and said polysilicon film to form a laminated structure of a polysilicon film and a nitride film on said first oxide film;
    (d) selectively removing said first oxide film and said SOI layer to define an active region by the rest of said first SOI layer and to expose end portions of said active region and said first oxide film beyond end portions of said laminated structure;
    (e) by thermal oxidation, forming second oxide films on the side surfaces of said polysilicon film;
    (f) forming an isolation oxide film to expose an upper major surface of said nitride film;
    (g) removing said laminated structure; and
    (h) isotropically removing said first oxide film, said isolation oxide film and said second oxide film until exposing an upper major surface of said active region.

11. A method of fabricating a semiconductor device formed on an SOI substrate prepared by stacking a buried oxide film and an SOI layer on a silicon substrate, comprising the steps of:
    (a) forming a first oxide film on said SOI substrate;
    (b) successively forming a polysilicon film and a nitride film on said first oxide film;
    (c) selectively removing said nitride film and said polysilicon film to form a laminated structure of a polysilicon film and a nitride film on said first oxide film;
    (d) by thermal oxidation, forming second oxide films on the side surfaces of said polysilicon film while increasing the thickness of said first oxide film around said laminated structure;
    (e) selectively removing said first oxide film and said SOI layer to partially leave the portion of said first oxide film with increased thickness to define an active region by the rest of said SOI layer and to expose end portions of said active region and said first oxide film beyond end portions of said laminated structure;
    (f) forming an isolation oxide film to expose an upper major surface of said nitride film;
    (g) removing said laminated structure; and
    (h) isotropically removing said first oxide film, said isolation oxide film and said second oxide film until exposing an upper major surface of said active region.

* * * * *

UNITED STATES PATENT AND TRADEMARK OFFICE
CERTIFICATE OF CORRECTION

PATENT NO. : 6,225,148 B1
DATED : May 5, 2001
INVENTOR(S) : Shoichi Miyamoto et al.

Page 1 of 1

It is certified that error appears in the above-identified patent and that said Letters Patent is hereby corrected as shown below:

<u>Column 13,</u>
Line 39, change "file" to -- film --.

Signed and Sealed this

Twelfth Day of March, 2002

Attest:

JAMES E. ROGAN
*Attesting Officer*  *Director of the United States Patent and Trademark Office*